US005438548A

United States Patent [19]
Houston

[11] Patent Number: 5,438,548
[45] Date of Patent: Aug. 1, 1995

[54] SYNCHRONOUS MEMORY WITH REDUCED POWER ACCESS MODE

[75] Inventor: Theodore W. Houston, Richardson, Tex.

[73] Assignee: Texas Instruments Incorporated, Dallas, Tex.

[21] Appl. No.: 165,278

[22] Filed: Dec. 10, 1993

[51] Int. Cl.⁶ .............................................. G11C 7/02
[52] U.S. Cl. ..................... 365/227; 365/233.5; 365/233; 365/230.08; 365/189.05
[58] Field of Search ...................... 365/227, 233.5, 233, 365/230.08, 189.08, 189.07, 203, 207

[56] References Cited

U.S. PATENT DOCUMENTS

| | | | |
|---|---|---|---|
| 4,707,809 | 11/1987 | Ando | 365/233.5 X |
| 4,894,803 | 1/1990 | Aizaki | 365/233.5 X |
| 4,932,001 | 6/1990 | Chow et al. | 365/233.5 |
| 5,047,984 | 9/1991 | Monden | 365/203 |
| 5,124,584 | 6/1992 | McClure | 365/233.5 X |
| 5,214,610 | 5/1993 | Houston | 365/233.5 |
| 5,313,434 | 5/1994 | Abe | 365/233.5 |
| 5,327,394 | 7/1994 | Green et al. | 365/233.5 |
| 5,335,206 | 8/1994 | Kawamoto | 365/233.5 |

Primary Examiner—Joseph A. Popek
Assistant Examiner—Huan Hoang
Attorney, Agent, or Firm—Jacqueline J. Garner; Richard L. Donaldson; William E. Hiller

[57] ABSTRACT

The synchronous memory (30) includes an address transition detection and control circuitry (42) which detects whether a net change in a selected portion of the address has occurred between consecutive active edges of the clock signal. If an address transition is detected, then a full memory cycle is initiated as usual. However, if no address transition is detected, the amount of activity performed in that memory cycle is reduced or modified to eliminate certain full memory cycle operations. In the reduced power memory cycle, the data already retained by the latches at the sense amplifiers (36) are accessed rather than accessing the memory array (32) for the same data.

17 Claims, 2 Drawing Sheets

SYNCHRONOUS MEMORY WITH REDUCED POWER ACCESS MODE

TECHNICAL FIELD OF THE INVENTION

This invention relates in general to the field of synchronous logic circuits, and more particularly to synchronous semiconductor memories having reduced power consumption.

BACKGROUND OF THE INVENTION

Address transition detection is typically used in asynchronous memories to detect when the address changes and to initiate a memory cycle. During a full memory cycle a number of activities, such as word line enable, bit line precharge, and sense amplifier enable, are performed. In one memory access, the contents of memory cells in a specific row as indicated by the row address are read, and final output from the memory are a subset of the accessed data as specified by the column address. In certain asynchronous memories, a low power fast access mode is made possible by distinguishing row address changes from column address changes, where a memory array access is initiated only when the row address changes.

It is desirable to apply the same technique to synchronous memories which uses a clock signal. However, some difficulties need to be overcome in order to do so. First, in synchronous memories, the address is required to be valid only at selected portions of the clock cycle. Thus it is imperative to distinguish address transitions from one valid address to the next valid address, allowing for possible transitions therebetween. Second, since some synchronous memories derive a performance benefit from initiating activities upon a clock edge, delaying such initiation to distinguish an address transition could cause an undesirable increase in access time.

Thus there is a need for synchronous memories incorporating address transition detection. There is a further need for synchronous memories incorporating address transition detection that allows for instances in the clock cycle during which address is not valid. Additionally, it is advantageous to incorporate the address transition detection without delaying access time.

SUMMARY OF THE INVENTION

In accordance with the present invention, a synchronous memory with reduced power access mode is provided. The synchronous memory of the present invention eliminates or substantially reduces the power required to access the memory when selected address bits are unchanged from the previous cycle.

In one aspect of the present invention, the synchronous memory includes an address transition detection and control circuitry which detects whether a change in a selected portion of the address has occurred at the valid address portion of a clock cycle relative to the valid address portion the previous cycle. If an address transition is detected, then a full memory cycle is initiated as usual. However, if no address transition is detected, the amount of activity to be performed in that memory cycle is reduced to eliminate certain full memory cycle operations. In the reduced memory cycle, the data already retained by the latching sense amplifiers or latches at the sense amplifiers are accessed rather than accessing the memory array for the same data.

In another aspect of the invention, the synchronous memory includes an address transition detection circuitry for generating a transition signal in response to detecting a transition in a selected portion of an address input to the memory. A latch circuitry is coupled to the address transition detection circuitry for receiving and latching the address for comparison purposes. A pulse generator is further provided for receiving the clock signal and generating a clock pulse in response to the active edge of the clock signal. In response to the absence of the transition signal substantially coinciding with the clock pulse, a logic circuit coupled to the address transition detection circuitry and pulse generator generates a reduced power mode signal and enables a reduced memory cycle.

In yet another aspect of the present invention, the synchronous memory includes a plurality of memory cells arranged in rows and columns, where a latch is associated with each sense amplifier and is coupled to each column of memory cells for receiving and storing data from the selected row of memory cells. An address transition detection and control circuitry is provided for detecting a transition in a row address and generating a first control signal in response thereto. The first control signal acts to enable a reduced memory cycle, disable access of said memory cells, and further enable the access of the latching sense amplifiers associated with selected columns.

In another aspect of the present invention, a method for low power fast access of a synchronous memory includes the steps of receiving a clock signal, detecting no transition in an address input upon an active edge of said clock signal, and then not enabling the initiation of a full memory cycle and instead enabling a reduced power memory cycle for accessing data already present at the output.

BRIEF DESCRIPTION OF THE DRAWINGS

For a more complete understanding of the present invention, and the advantages thereof, reference is made to the following descriptions taken in conjunction with the accompanying drawings, in which.

DETAILED DESCRIPTION OF THE INVENTION

The preferred embodiment of the present invention and its advantages are best understood by referring to FIGS. 1–5 of the drawings, like numerals being used for like and corresponding parts of the various drawings.

Figure 1:
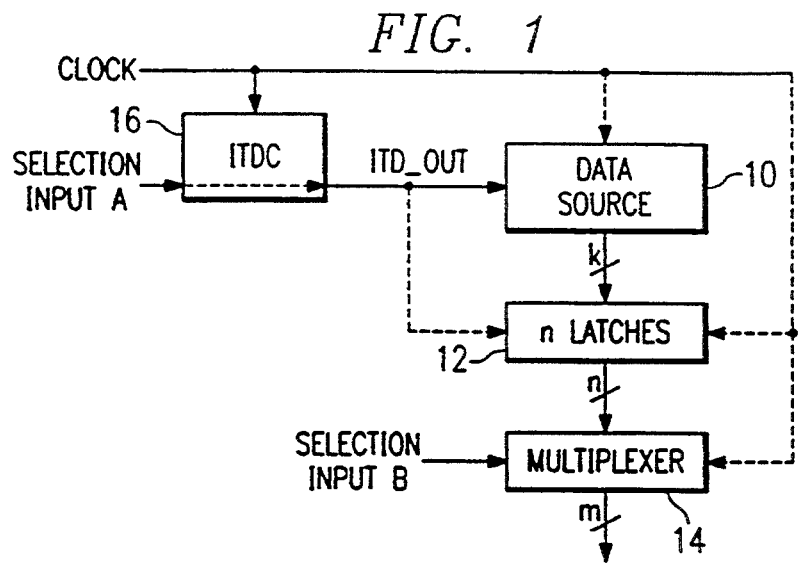
FIG. 1 is a simplified block diagram of a system utilizing the general concept of the invention.

A general description of one aspect of the invention is illustrated in FIG. 1. A source 10 of multiple bits of data, from which k bits of data are transferred to n-bit latches 12 in response to a CLOCK input and SELECTION INPUT A. Generally, the number of latches 12, n, is less than or equal to the number of bits k that are accessed at any one time. If n is less than k, then part of SELECTION INPUT A specifies which of the k bits are to be stored in latches 12. In systems where n is greater than k, part of SELECTION INPUT A specifies into which of the n latches the accessed k bits are to be stored. Information from latches 12 is provided to a multiplexer 14, from which m bits of data are provided as the final output, where m is less than n, in response to SELECTION INPUT B and the CLOCK signal.

The SELECTION INPUT A is further provided to an input transition detection and control (ITDC) circuit 16. Input transition detection and control circuit 16 generates and outputs a control signal ITD_OUT that is further provided to data source 10. The control signal ITD_OUT controls data source 10 such that activity therein is reduced in a given clock cycle if there is no transition in SELECTION INPUT A. In particular, the duration of activity may be shortened, or the number of operations enabled in that cycle may be reduced. Input transition detection and control circuit 16 may be constructed according to any conventional circuits known in the art.

In particular, the environment illustrated in FIG. 1 may be a synchronous memory array comprising memory cells arranged in rows and columns, row address decode and word line drivers, column multiplexers, and sense amplifiers. If there is a one-to-one correspondence between the sense amplifiers and columns, then SELECTION INPUT A consists of row address bits, and SELECTION INPUT B consists of column address bits and/or block address bits, if memory array is arranged in blocks. In large memories where there are multiple stages of multiplexing, one multiplexer may serve as data source 10 for subsequent latches and multiplexers.

Figure 2:
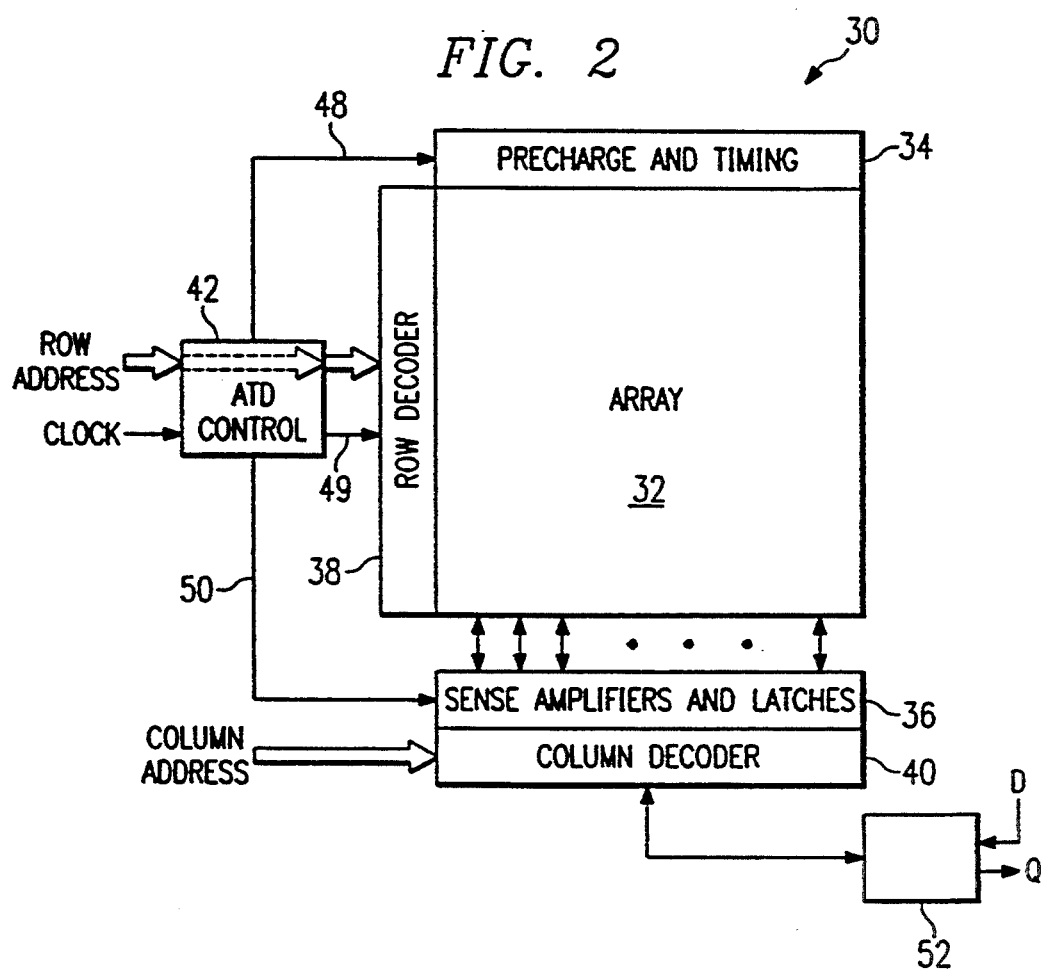
FIG. 2 is a top level block diagram of a memory constructed according to the teachings of the present invention.

Referring to FIG. 2, a specific application of the present invention to a memory structure 30 is shown. Memory 30, which may be a synchronous RAM, ROM or any other memory that receives a clock signal and acts upon its active edge, may benefit from incorporating the instant invention. Memory 30 includes an array 32 having memory cells arranged in rows and columns, a precharge and timing circuitry 34, sense amplifiers and latches 36, and row and column decoders 38 and 40.

An address transition detection and control circuit 42 is further provided to receive the row addresses and to detect any transition or change therein. Address transition detection and control circuit 42 also receives the system clock signal, which may be provided to other portions of memory 30, details of which are omitted. Address transition detection and control circuit 42 generates control signals and may provide them on lines 48–50, which are coupled to certain control circuits of the memory, including precharge and timing circuit 34, row decoder 38, and sense amplifiers and latches 36, respectively. It is known that sense amplifiers may be integral or separate from latches associated therewith. Depending on the desired operation and implementation of the synchronous memory, the control signals provided to one or more of these components may be optional. An output buffer 52 is further provided to sequentially output selected data stored in sense amplifier latches 36. Address transition detection and control circuit 42 may be constructed according to any of the various conventional circuits known in the art, details of which are not discussed herein.

In operation, synchronous memory 30 may be operated in a low power access mode by using address transition detection. Depending on detected transitions in the row address, the contents read from array 32 into sense amplifiers and latches 36 are over-written or retained. If no transition in the row address is detected by address transition detection and control circuit 42, then the contents of sense amplifiers and latches 36 are readily provided to output buffer 52 in a reduced power memory cycle without the precharge, selected row energizing, and sensing operations of a full memory cycle.

If a transition in the row address is detected by address transition detection and control circuit 42, then control signals on lines 48 and 50 cause new data to be read from array 32 and written into sense amplifiers and latches 36 as in the execution of a full memory cycle. Constructed and operated in this manner, full memory clock cycles are not required to read array 32 if the same information is required at the output. Therefore, power consumption is reduced. In some memories, the application of address detection may enable an earlier access of valid data which may result in a faster access mode.

Figure 3:
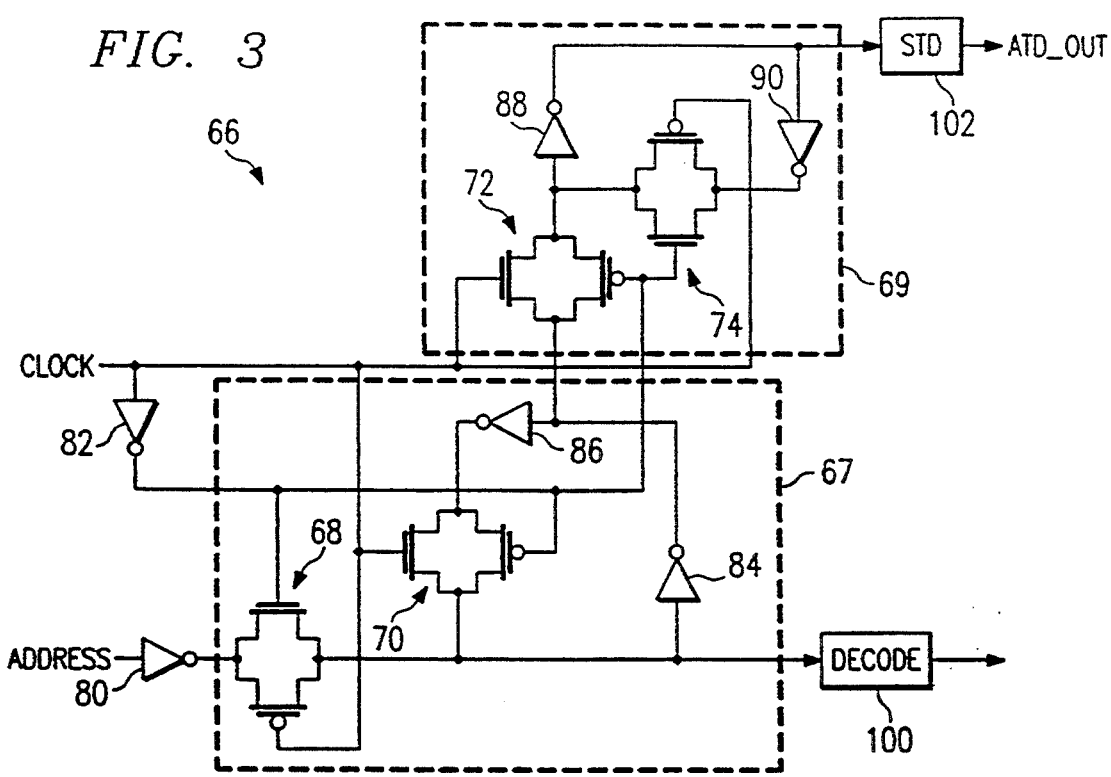
FIG. 3 is a schematic diagram of an embodiment of the latching mechanism for address transition detection.
Figure 4:
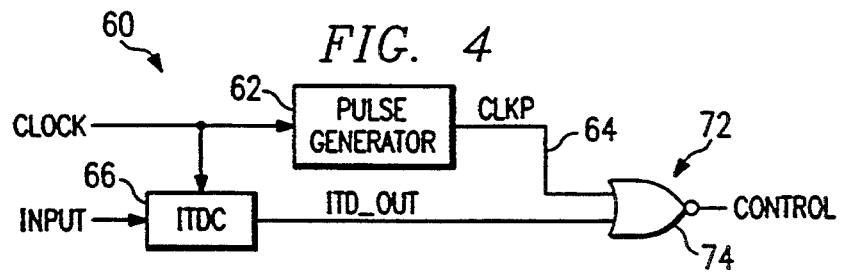
FIG. 4 is a block diagram of an embodiment of one aspect of the invention.

Referring to FIGS. 3 and 4, a more detailed schematic diagram of an exemplary implementation of an input transition detection and control (ITDC) circuit 66 is shown. Input transition detection and control circuit 66 includes latches 67 and 69. Latch 67 includes CMOS (complementary MOS) pass gates 68 and 70 and inverters 84 and 86. Latch 69 includes CMOS pass gates 72 and 74 and inverters 88 and 90. The clock signal controls the operation of pass gates 68–74. When the clock signal is low, the current input is passed to the decode circuit 100 and to the input of latch 67, and the previous input is latched in latch 69. When the clock transitions high, the current input is latched in latch 67 and is passed into latch 69. If this current input is different from the previous input that had been latched in latch 69, an input transition will be detected by a signal transition detection (STD) circuit 102. The output of signal transition detection circuit 102 is then provided to a control or logic circuitry. Signal transition detection circuit 102 may be constructed by any of the various conventional circuits known in the art. With input transition detection and control circuit 66, the input needs to be valid only at the low to high transition of the clock in the exemplary circuit shown. Transition or change between a valid input of one cycle to the valid input of the next cycle is detected, while changes in the input at other times in the clock cycle is ignored. Other circuits may be designed for systems in which the input is valid at some different time in the clock cycle.

Latch construction as shown in FIG. 3 serves only as an example of a means of saving input from one clock cycle for comparison with input from the next cycle. Other circuit configurations will be apparent to those skilled in the art. Other variations are also anticipated. For example, decode circuitry 100 may be driven from latch 69 instead of latch 67.

For some systems, it may be undesirable to delay the initiation of an access by waiting on the generation of an input transition signal. For some systems, this delay can be reduced by having the input processed in parallel with the generation of the ITD_OUT signal. The ITD_OUT signal then controls subsequent activity. For example, in application to a memory, the address decode can proceed in parallel with the ATD_OUT signal generation, and the ATD_OUT signal may be used to enable the word line drivers, or control the enabling of sense amplifiers 36 (FIG. 2). The amount of activity to be controlled by the ITD_OUT signal can be determined by a trade-off analysis of introduced delay and power saved.

Another approach to the trade-off of introduced delay and power saved is to initiate activity with the control signal, for example the clock signal, but then disable activity if an ITD_OUT signal is not generated within some predetermined interval from the clock transition. For example, in a memory, it may take longer to generate an ATD_OUT signal than to accomplish the address decode and start the word line drive. In this case, the decode activity can be done in parallel with the ATD_OUT signal generation and the word line drive initiated but turned off if an ATD_OUT is not generated within some predetermined interval from the clock edge.

An exemplary circuit to generate a control signal, the duration of which is extended if an input transition is detected, is shown in FIG. 4. A pulse generator 62 receives the system clock signal and generates a clock pulse 64, labeled CLKP. The input signal(s) is received by input transition detection and control circuit 66. The input signal(s) is also provided to other circuitry for processing. For example, if the input signals are row address bits, they are also provided to the row address decode circuitry 38 (FIG. 2). The output from pulse generator 62 and input transition detection and control circuit 66 are provided to a logic circuit 72, shown here as a NOR gate 74. The output of NOR gate 74 is provided to a control circuitry of the memory, which may be word line drivers, sense amplifiers and/or precharge and timing circuits.

Figure 5A:
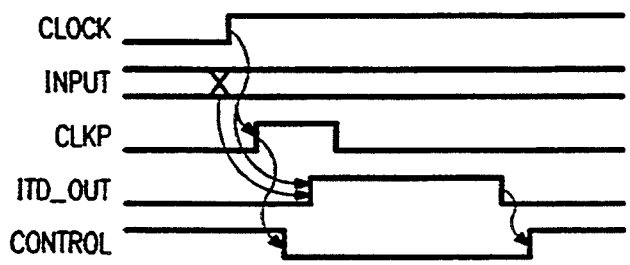
FIG. 5a is a timing diagram illustrating the operation of the present invention.

Referring also to FIG. 5a, a timing diagram of an instance where input transition occurs is shown. Upon detecting an active edge of clock signal, pulse generator 62 generates a pulse labeled CLKP. The clock pulse causes the output of NOR gate 74 to go low. The transition in the input is detected and translated into a high logic level signal on the output of input transition detection circuit 66, labeled as ITD_OUT. The output of NOR gate 74, becomes low in response to CLKP, remains low for the duration of ITD_OUT high. Thus a full activity cycle is initiated.

Figure 5B:
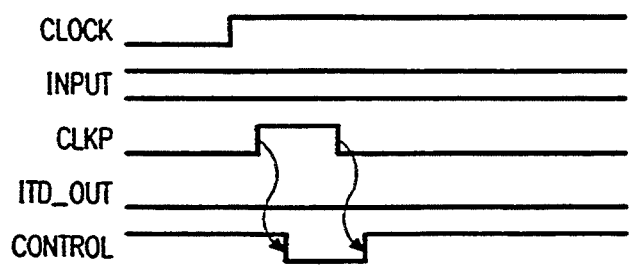
FIG. 5b is another timing diagram illustrating the operation of the present invention.

Referring to FIG. 5b, a timing diagram demonstrating the operation of circuit 60 when the input does not change is shown. A pulse is generated upon the active edge of CLOCK signal, which causes the output of NOR gate 74 to go low. However, since the address lacks transition, or change, the output of NOR gate 74 immediately goes back to high at the end of the pulse, CLKP. Controlled in this manner, the activity of the cycle is curtailed. If applied to a memory, the wordlines are disabled and latching sense amplifiers 36 are disassociated from memory array 32 but enabled for access so that the data already present therein may be readily accessed in a reduced power access. Depending on the system environment, this may also be accomplished by supplying a clock signal with a relatively short active phase similar to that created by pulse generator 62, thus eliminating the need therefor.

Although the present invention and its advantages have been described in detail, it should be understood that various changes, substitutions and alterations can be made therein without departing from the spirit and scope of the invention as defined by the appended claims.

What is claimed is:

1. A synchronous memory with reduced power access mode, comprising:
   a row address decoder coupled to said memory for receiving and decoding row addresses;
   a plurality of sense amplifier and latch circuits coupled to said memory;
   an address transition detection circuitry coupled to said row address decoder and said plurality of sense amplifier and latch circuits for receiving an address and generating a transition signal in response to detecting a transition in said address, said transition signal causing, an enabling of said sense amplifier and latch circuits and an absence of said transition signal causing a disabling of the sense amplifier and latch circuits; and
   a control circuit coupled to said address transition detection circuitry and memory, said control circuit initiating a full memory access cycle in response to said transition signal occurring during a valid portion of a clock signal, and initiating a reduced memory access cycle in response to an absence of said transition signal during said valid portion of said clock signal.

2. The synchronous memory, as set forth in claim 1, further comprising:
   a first latch for receiving and latching said address during a first phase of said clock signal;
   a second latch coupled to said first latch for receiving and latching an output from said first latch during a second phase of said clock signal; and
   said address transition detection circuitry generating said transition signal in response to a change in said address latched in said second latch.

3. The synchronous memory, as set forth in claim 1, wherein said address received by said address transition detection circuitry is a selected subset of address bits required to access said memory.

4. The synchronous memory, as set forth in claim 1, further comprising:
   word line drivers coupled to said row address decoder and memory; and
   wherein said address transition detection circuitry generates said transition signal in response to detecting a transition in said row address, said transition signal causing an enabling of said word line drivers.

5. The synchronous memory, as set forth in claim 1, further comprising:
   a row address decoder coupled to said memory for receiving row addresses and decoding thereof; and
   wherein said address transition detection circuitry generates said transition signal in parallel with said decoding of row address in response to detecting a transition in said row address.

6. The synchronous memory, as set forth in claim 1, further comprising:
   a pulse generator for receiving said clock signal and generating a clock pulse in response to an active edge of said clock signal; and
   a logic circuit coupled to said address transition detection circuitry and pulse generator for generating an extended control signal in response to said transition signal substantially coinciding with said clock pulse for initiating a full memory access cycle.

7. The synchronous memory, as set forth in claim 1, further comprising:

a pulse generator for receiving said clock signal and generating a clock pulse in response to an active edge of said clock signal; and a logic circuit coupled to said address transition detection circuitry and pulse generator for generating a shortened control signal in response to an absence of said transition signal during said clock pulse for initiating a reduced memory access cycle.

8. The synchronous memory, as set forth in claim 1, wherein said control circuit includes word line drivers.

9. An integrated circuit, comprising:

a circuitry receiving an input and generating an output in response to said input and an active portion of a clock signal;

an input transition detection circuit coupled to said circuitry for generating a transition signal in response to a transition in said input;

a control circuit coupled to said circuitry and input transition detection circuit for effecting a reduced activity cycle in response to an absence of said transition signal, and for effecting a full activity cycle in response to the presence of said transition signal;

a first latch for receiving and latching said input during a first phase of said clock signal; and a second latch coupled to said first latch for receiving and latching an output from said first latch during a second phase of said clock signal;

said input transition detection circuitry generating said transition signal in response to a change in said input latched in said second latch.

10. The integrated circuit, as set forth in claim 9, further comprising:

a pulse generator for receiving said clock signal and generating a clock pulse in response to an active edge of said clock signal; and a logic circuit coupled to said input transition detection circuitry and pulse generator for generating an extended control signal in response to said transition signal substantially coinciding with said clock pulse for initiating a full activity cycle.

11. The integrated circuit, as set forth in claim 9, further comprising:

a pulse generator for receiving said clock signal and generating a clock pulse in response to an active edge of said clock signal; and a logic circuit coupled to said input transition detection circuitry and pulse generator for generating a shortened control signal in response to an absence of said transition signal during said clock pulse for initiating a reduced activity cycle.

12. A method for reducing the operation of a synchronous memory having rows and columns of memory cells and a plurality of output latches associated with said columns of memory cells, comprising the steps of:

receiving a clock signal and an input;

initiating operation of said synchronous memory in response to a transition of said clock signal;

detecting no valid transition in a selected portion of said input in relation to said clock signal;

reducing the operation of said synchronous memory, in response thereto; and enabling a reduced memory cycle for accessing data already accessed from the memory in response to detecting no valid transition in a selected portion of address input by disassociating said output latches from said memory cells; and enabling access of selected ones of said output latches.

13. The method, as set forth in claim 12, wherein said operation reducing step includes the step of shortening the duration of the operation of said integrated circuit in response thereto.

14. The method, as set forth in claim 12, wherein said operation reducing step includes the step of reducing the number of enabled operations in response thereto.

15. The method, as set forth in claim 12, further comprising the steps of:

generating a control output signal in response to said transition of said clock signal; and shortening the length of said control output signal in response to detecting no valid transition in said selected portion of said input.

16. The method, as set forth in claim 12, wherein said step of receiving a clock signal further includes the step of generating a clock pulse in response to receiving an active edge of said clock signal.

17. The method, as set forth in claim 12, further comprising the step of receiving and latching said address input.

* * * * *